US011454691B1

(12) United States Patent
Kellman et al.

(10) Patent No.: US 11,454,691 B1
(45) Date of Patent: Sep. 27, 2022

(54) SYNTHETIC BRIGHT-BLOOD AND DARK-BLOOD PSIR LGE IMAGES

(71) Applicants: THE UNITED STATES OF AMERICA, as represented by the Secretary, Department of Health and Human Services, Bethesda, MD (US); Siemens Healthcare GmbH, Erlangen (DE)

(72) Inventors: Peter Kellman, Bethesda, MD (US); Hui Xue, Rockville, MD (US); Kelvin Chow, Chicago, IL (US)

(73) Assignees: Siemens Healthcare GmbH, Erlangen (DE); The United States of America, as represented by the Secretary, Department of Health and Human Services, Bethesda, MD (US)

( * ) Notice: Subject to any disclaimer, the term of this patent is extended or adjusted under 35 U.S.C. 154(b) by 0 days.

(21) Appl. No.: 17/472,838

(22) Filed: Sep. 13, 2021

(51) Int. Cl.
G01R 33/56 (2006.01)
G01R 33/50 (2006.01)

(52) U.S. Cl.
CPC ......... G01R 33/5608 (2013.01); G01R 33/50 (2013.01); G01R 33/5607 (2013.01)

(58) Field of Classification Search
CPC . G01R 33/50; G01R 33/5607; G01R 33/5608
See application file for complete search history.

(56) References Cited

U.S. PATENT DOCUMENTS

| 10,198,810 B2 | 2/2019 | Chow et al. | |
| 10,551,462 B2 | 2/2020 | Chow et al. | |
| 2015/0077106 A1* | 3/2015 | Kim | G01R 33/3607 324/309 |
| 2017/0030990 A1* | 2/2017 | Janich | A61B 5/055 |
| 2019/0064299 A1* | 2/2019 | Botnar | G01R 33/4818 |

OTHER PUBLICATIONS

Aherne, Emily et al., "Cardiac T1 Mapping: Techniques and Applications", J. Magn. Reson. Imaging, 2020, Issue 51, DOI: 10.1002/jmri.26866, (pp. 1336-1356, 21 total pages).
Guo, Rui et al., "Free-breathing simultaneous myocardial T1 and T2 mapping with whole left ventricle coverage", Magnetic Resonance in Medicine, 2021, Issue 85, (pp. 1308-1321, 14 total pages).
(Continued)

Primary Examiner — Gregory H Curran

(57) ABSTRACT

Systems and methods to determine a first map of a first parameter based on first signals acquired by a magnetic resonance imaging system, the first map associating each of a plurality of voxels with a respective value of the first parameter, the first parameter quantifying a first physical characteristic of an object represented by the plurality of voxels, determine a second map of a second parameter based on the first signals, the second map associating each of the plurality of voxels with a respective value of the second parameter, the second parameter quantifying a second physical characteristic of the object, and determine a dark-blood phase-sensitive inversion recovery late gadolinium enhancement image based on the first map of the first parameter and on the second map of the second parameter.

20 Claims, 5 Drawing Sheets

(56) References Cited

OTHER PUBLICATIONS

Chow, Kelvin, et al., "Improved Accuracy and Precision In Simultaneous Myocardial T1 and T2 mapping with Multi-Parametric SASHA (mSASHA)", Magnetic Resonance in Medicine, (pp. 1-27, 27 total pages).

Chow, Kelvin et al., "Saturation Recovery Single-Shot Acquisition (SASHA) for Myocardial T1 Mapping", Magnetic Resonance in Medicine, Issue 71, (2014), DOI: 10.1002/mrm.24878, (pp. 2082-2094, 14 total pages).

Taylor, Andrew J. et al., "T1 Mapping: Basic Techniques and Clinical Applications", JACC: Cardiovascular Imaging, vol. 9, No. 1, Jan. 2016, (pp. 67-81, 15 total pages), ISSN: 1936-878X, http://dx.doi.org/10.1016/j.icmg.2015.11.005.

* cited by examiner

SYNTHETIC BRIGHT-BLOOD AND DARK-BLOOD PSIR LGE IMAGES

BACKGROUND

A Magnetic Resonance (MR) scanner generates images of patient anatomy using timed sequences of RF pulses. MR imaging is useful in scenarios requiring high contrast between different soft tissues. Cardiovascular MR (CMR) imaging is increasingly used to non-invasively evaluate myocardial structure and function without requiring ionizing radiation as in other imaging modalities.

Late gadolinium enhancement (LGE) MR imaging facilitates evaluation of myocardial scar. Gadolinium-based contrast agents decrease $T_1$ relaxation times of tissue in which it resides and tends to accumulate within scar rather than within normal myocardium. Areas of decreased $T_1$ relaxation times may therefore correspond to scar and may be visualized using $T_1$-weighted phase-sensitive inversion recovery (PSIR) LGE imaging, or bright-blood (BB) LGE imaging.

Effective comparison of normal myocardium to scar using BB LGE imaging requires a reference region of normal myocardium. Diffuse scarring may reduce the presence of normal myocardium and thereby hinder this comparison. Even if BB LGE imaging achieves suitable contrast between infarcted and normal myocardium in a given scenario, contrast between scar and the blood pool will likely be poor. Since a large fraction of myocardial infarctions (MI) caused by coronary artery disease result in subendocardial scar adjacent to the blood pool, BB LGE imaging may be unsuitable for detecting MI in many cases.

Maps of $T_1$ relaxation time quantify the $T_1$ relaxation time of each voxel of mapped tissue. Normal myocardium exhibits a predictable $T_1$ relaxation time which changes in the presence of disease such as edema, fibrosis, and infiltrative diseases. $T_1$ maps may therefore be used to detect focal or diffuse disease, and to assess risk or perform early prognostication. However, $T_1$ maps often lack the degree of visual contrast needed for assessment of focal scar. Accordingly, a BB LGE imaging scan and a separate $T_1$ mapping scan are often required to comprehensively assess both focal- and globally-diseased myocardium. These scans often require repeated breath-holding and are unsuitably time-consuming. Moreover, the image and the map produced by the scans require spatial registration to one another.

Dark-blood PSIR LGE (DB LGE) imaging combines inversion recovery with either $T_2$ preparation or magnetization transfer. The $T_2$ weighting suppresses the myocardial signal, shifting the null time of the myocardium with respect to the blood. DB LGE imaging may thereby increase the degree of contrast between subendocardial scar and the adjacent blood pool, increasing the detectability of MI as compared to BB LGE in some cases. However, generation of a DB LGE image in addition to a BB LGE (and/or a $T_1$ map) would require another separate acquisition and additional spatial registration. DB LGE imaging is therefore inefficient to integrate into existing CMR clinical workflows.

Systems are desired for efficiently assessing both diffuse and focal cardiovascular disease.

DETAILED DESCRIPTION

The following description is provided to enable any person in the art to make and use the described embodiments. Various modifications, however, will remain readily apparent to those in the art.

Some embodiments provide simultaneous calculation of both BB LGE and DB LGE images from acquired $T_1$ and $T_2$ maps. In some embodiments, the $T_1$ and $T_2$ maps are jointly acquired using a single free-breathing sequence, and the BB LGE and DB LGE images are calculated therefrom as described above. This approach requires only one scan and the resulting two maps and two images are inherently co-registered, thereby facilitating subsequent anatomical assessment.

Figure 1:
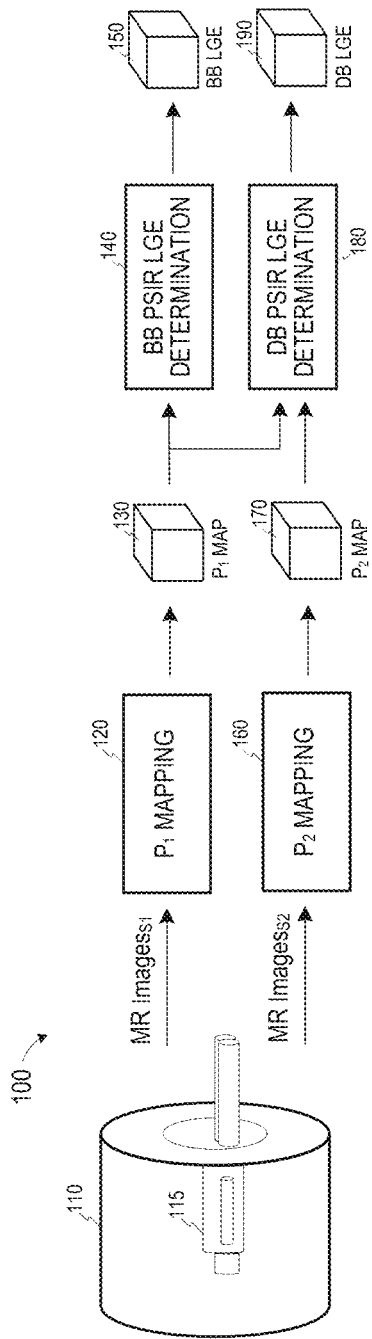
FIG. 1 illustrates an architecture for generating two parametric maps and two PSIR LGE images according to some embodiments.

FIG. 1 illustrates architecture 100 depicting generation of two parametric maps and two PSIR LGE images according to some embodiments.

MR scanner 110 may comprise any suitable MR scanner that is or becomes known. MR scanner 110 executes a first pulse sequence to generate first MR signals (i.e., k-space signals) from which MR images$_{s1}$ of subject 115 are generated as is known in the art. MR scanner 110 also executes a second pulse sequence to generate second MR signals from which MR images$_{s2}$ of subject 115 are generated. The first pulse sequence is determined such that resulting MR images$_{s1}$ are suitable for determination of parameter $P_1$ and the second pulse sequence is determined such that resulting MR images$_{s2}$ are suitable for determination of parameter $P_2$.

In the following example, parameter $P_1$ is $T_1$ relaxation time and parameter $P_2$ is $T_2$ relaxation time, but embodiments are not limited thereto. Parameter $P_1$ and parameter $P_2$ may comprise any parameters which quantify a physical characteristic of the imaged subject. The $T_1$ relaxation time is the time required for the longitudinal magnetization of a proton to recover to 63% of equilibrium following saturation. $T_1$ mapping generally includes acquisition of a series of images and calculating the $T_1$ relaxation time of each voxel represented in the series of images.

MR images$_{s1}$ may therefore be acquired using any MR sequence for producing images from which a $T_1$ map may be generated. Generally, such a sequence acquires a series of images at various inversion times ($T_I$). Sequences for acquiring MR images$_{s1}$ according to some embodiments include but are not limited to a Look-Locker sequence, a Modified Look-Locker Inversion (MOLLI) recovery sequence and a SAturation recovery single-SHot Acquisition (SASHA) sequence, all of which are known in the art. As is also known in the art, the sequence used to acquire MR images$_{s1}$ may be executed after (e.g., 10-20 minutes after) administration of a $T_1$-shortening contrast agent (e.g., a gadolinium-based contrast agent) to subject 115.

$P_1$ mapping component 120 operates to determine $P_1$ map 130 based on MR images$_{s1}$. Since MR images$_{s1}$ are themselves determined based on first MR signals acquired by MR scanner 110, it is accurate to note that $P_1$ map 130 is determined based on these first MR signals. In some embodiments, $P_1$ mapping component 120 operates to determine $P_1$ map 130 directly from first MR signals acquired by MR scanner 110 without requiring generation of intermediate MR images$_{s1}$.

Continuing the above example, $P_1$ mapping component 120 may use curve fitting to calculate the $T_1$ relaxation time of each voxel of subject 115 represented within MR images$_{s1}$ as is known in the art. Component 120 and each other component described herein may be implemented using any combination of hardware and/or software. Some components may share hardware and/or software of one or more other components.

BB PSIR LGE determination component 140 generates BB LGE image 150 based on $P_1$ map 130. The BB-PSIR signal using a standard IR LGE sequence is exponentially weighted and the value of each voxel of BB LGE image 150 may be determined as $1-2e^{-T_I/T_1}$, where the inversion time $T_I$ is set to a value which nulls normal myocardium and $T_1$ is the $T_1$ relaxation time of the subject voxel.

Alternatively, component 140 may determine the value of each voxel as a linearly relationship to contrast concentration, i.e., $R_1 - R_{1m}$, where $R_1 = 1/T_1$, and $R_{1m}$ corresponds to the value of $R_1$ for normal myocardium. Calculation of BB LGE image 150 in this manner nulls the normal myocardium and provides positive contrast, i.e., tissue exhibiting shorter $T_1$ relaxation times such as MI will appear brighter than other tissue. The voxels values are directly proportional to $R_1$, which in turn is proportional to the gadolinium concentration [Gd], since $R_1 = R_{1o} + r_1$ [Gd], where $R_{1o}$ is the native $R_1$ prior to administering gadolinium and $r_1$ is the relaxivity of the gadolinium contrast agent. In the following example, parameter $P_1$ is $T_1$ relaxation time and parameter $P_2$ is $T_2$ relaxation time, but embodiments are not limited thereto. The $T_1$ relaxation time is the time required for the longitudinal magnetization of a proton to recover to 63% of equilibrium following saturation. $T_1$ mapping generally includes acquisition of a series of images and calculating the $T_1$ relaxation time of each voxel represented in the series of images.

Continuing the present example, parameter $P_2$ may comprise $T_2$ relaxation time. $T_2$ relaxation time is the time required for the transverse magnetization to fall to approximately 37% (i.e., 1/e) of its initial value. MR images$_{s2}$ may therefore be acquired using any MR sequence for producing images from which a $T_2$ map may be generated.

Images suitable for $T_2$ mapping may be acquired using a balanced steady-state free precession (bSSFP) readout sequence preceded by a multinomial $T_2$-preparation module. Each image represents a sample at a different echo time ($T_E$).

$P_2$ mapping component 160 determines $P_2$ map 170 based on MR images$_{s2}$. In the case of $P_2 = T_2$, MR images$_{s2}$ may be fitted to an exponential decay curve as is known in the art to determine $T_2$ of each voxel of map 170 therefrom. Again, since MR images$_{s2}$ are determined based on second MR signals acquired by MR scanner 110, it is accurate to note that $P_2$ map 170 may be considered as determined based on the second MR signals. $P_2$ mapping component 160 may, in some embodiments, operate to determine $P_2$ map 170 directly from second MR signals acquired by MR scanner 110 without requiring generation of intermediate MR images$_{s2}$.

DB PSIR LGE determination component 180 generates DB LGE image 190 based on $P_2$ map 170 and on $P_1$ map 130. The value of each voxel of DB LGE image 190 in IR-$T_2$ sequence may be determined as $(1-(1-((1-2e^{-T_{D1}/T_1})e^{-T_E/T_2}))e^{-T_{D2}/T_1})$, where parameters $T_{D1}$, $T_{D2}$, and $T_E$ are set to jointly null the normal myocardium while suppressing the blood and minimizing the $T_2$ preparation echo time $T_E$, and $T_1$ and $T_2$ are the $T_1$ and $T_2$ of the voxel according to map 170 and map 130.

The setting of parameters $T_{D1}$, $T_{D2}$, and $T_E$ may be performed manually, automatically, or semi-automatically. In the manual case, an operator chooses values for parameters $T_{D1}$, $T_{D2}$, and $T_E$ (based on the operator's knowledge or any other information) and DB LGE image 190 is calculated as indicated above. If the resulting DB LGE image 190 is unsatisfactory, the operator may choose one or more new values for re-calculation of DB LGE image 190.

In a semi-automatic case, an operator may define a region of interest within the imaged volume by, e.g., indicating a region within $P_2$ map 170, $P_1$ map 130, MR Images$_{s1}$, or MR Images$_{s2}$. Values of $T_1$ and $T_2$, within the region of interest are then determined from $P_2$ map 170 and $P_1$ map 130. Values of parameters $T_{D1}$, $T_{D2}$, and $T_E$ may be calculated based on these determined values of $T_1$ and $T_2$. In some embodiments, the region of interest may be automatically defined by segmenting MR Images$_{s1}$ or MR Images$_{s2}$ to automatically identify the myocardium and the heart.

As described with respect to component 140, component 180 may alternatively formulate the determination of DB LGE image 190 as directly proportional to $R_1$, with parameters set to null the normal myocardium and to set the blood to a fixed level below the myocardium. For example, each voxel may be determined as $(R_1 - (R_{1m}/(a\_DB(R_2/R_{2m}) + (1-a\_DB))))$, where $a\_DB = ((R_{1m}R_{2m}/(R_{1b} - LGE_b)) - R_{2m})/(R_{2b} - R_{2m})$, where $R_{1b}$ is $R_1$ for blood, $R_2 = 1/T_2$, and $R_{2b}$ and $R_{2m}$ are the $R_2$ for blood and normal myocardium respectively. $LGE_b$ is an adjustable parameter (e.g., −0.5) that may be varied to change the degree of blood suppression in DB LGE image 190.

In some embodiments of architecture 100, maps 130 and 170 and images 150 and 190 are obtained using only two scans, each of which may be implemented in a free-breathing patient-friendly protocol that can achieve the desired image quality in a reasonable acquisition time. Unlike conventional BB LGE and DB LGE image acquisition, operator input is not needed to select appropriate $T_1$ and $T_E$ relaxation if automatic determination of these parameters is used as above. Moreover, map 130 is spatially registered with image 150 and map 150 is spatially registered with image 190. Such features may enable faster and simpler assessment of diffuse and focal disease than previously available.

Figure 2:
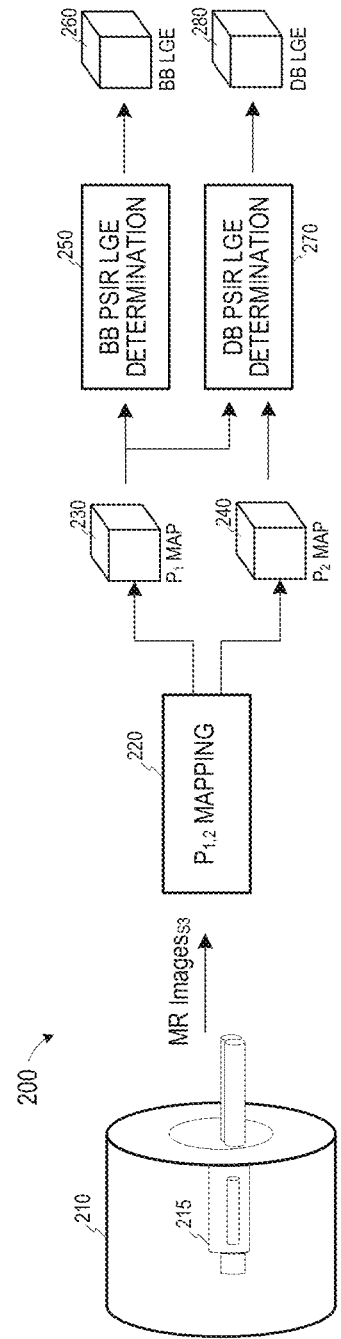
FIG. 2 illustrates an architecture for generating two parametric maps and two PSIR LGE images from a single MR scan according to some embodiments.

FIG. 2 illustrates architecture 200 according to other embodiments. Architecture 200 is similar to architecture 100 of FIG. 1 in that BB PSIR LGE determination component 250 generates BB LGE image 260 based on $P_1$ map 230, and DB PSIR LGE determination component 270 generates DB LGE image 280 based on $P_1$ map 230 and $P_2$ map 240. However, MR scanner 210 executes a single pulse sequence to acquire MR signals from which MR images$_{s3}$ of subject 215 are generated, and $P_1$ map 230 and $P_2$ map 240 are both generated based on MR images$_{s3}$. In some embodiments, $P_1$ map 230 and $P_2$ map 240 are both directly generated based on the acquired MR signals, and not based on MR images$_{s3}$.

The present description assumes that MR images$_{s3}$ are acquired using a sequence suitable for simultaneous $T_1$ and $T_2$ mapping, but the parameters are not limited thereto. Techniques which provide combined $T_1$ and $T_2$ mapping via a single sequence include cardiac magnetic resonance fingerprinting (cMRF), multitasking, joint $T_1/T_2$ mapping with saturation recovery, and 3D-QALAS. Combined $T_1$ and $T_2$ mapping techniques advantageously produce inherently co-registered maps, which may be combined without concern for the spatial misalignment which might occur when combining data from separate acquisitions. According to some embodiments, MR scanner 210 executes a saturation recovery (SR)-based multi-parametric SASHA sequence to generate MR images$_{s3}$. Such a sequence, which will be described in more detail below, may be implemented in a free-breathing protocol which achieves a desired image quality in a reasonable acquisition time.

Mapping component 220 fits MR images$_{s3}$ to a multi-parametric model to determine $P_1$ map 230 and $P_2$ map 240. In a case that $P_1=T_1$ and $P_2=T_2$, BB PSIR LGE determination component 250 may generate BB LGE image 260 based on $P_1$ map 230 in either manner described above. Similarly, DB PSIR LGE determination component 270 may generate DB LGE image 280 based on $P_1$ map 230 and $P_2$ map 240 in either manner described above.

Some embodiments of architecture 200 allow execution of a single protocol with a stack of slices covering the myocardium without requiring a pause between slices, since all measurements are preceded by saturation preparations. Since the BB and DB LGE images are calculated from the $T_1$ and $T_2$ maps, $T_1$ and $T_E$ times of the protocol do not require operator input.

Advantageously, $P_1$ map 230 and $P_2$ map 240, BB LGE image 260 and DB LGE image 280 are intrinsically co-registered, simplifying analysis thereof and reporting based thereon. BB LGE image 260 and DB LGE image 280 can be directly compared and $P_1$ map 230 and $P_2$ map 240 can be directly compared, without potential slice mismatch between multiple separate scans. $P_1$ map 230 and $P_2$ map 240, BB LGE image 260 and DB LGE image 280 may be used as different channel inputs in a deep learning model to improve classification and segmentation of myocardium.

Figure 3:
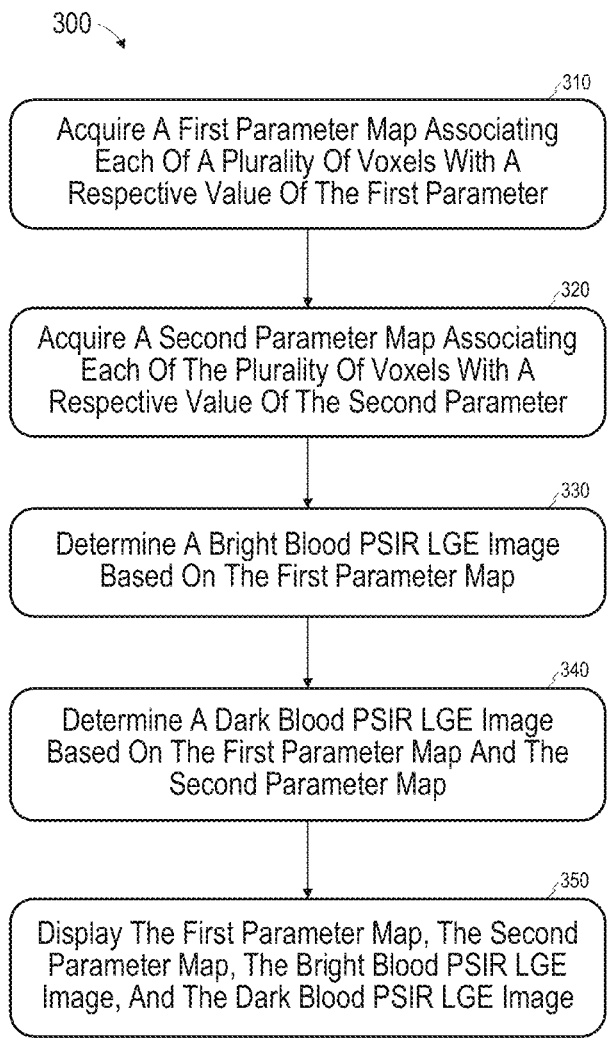
FIG. 3 comprises a flow diagram of a process to generate two parametric maps and two PSIR LGE images according to some embodiments.

FIG. 3 comprises a general flow diagram of process 300 according to some embodiments. Process 300 may be executed by architecture 100 or architecture 200, but embodiments are not limited thereto. In some embodiments, various hardware elements (e.g., one or more processing units) execute program code to perform process 300. The steps of process 300 need not be performed by a single device or system, nor temporally adjacent to one another.

Process 300 and all other processes mentioned herein may be embodied in processor-executable program code read from one or more of non-transitory computer-readable media, such as a disk-based or solid-state hard drive, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, at 310, a first parameter map associating each of a plurality of voxels with a respective value of the first parameter is acquired. The first parameter may comprise any suitable parameter, and the first parameter map may be acquired, for example, based on a first series of images acquired using a first MR pulse sequence as shown in FIG. 1, based on a second series of images acquired using a second MR pulse sequence as shown in FIG. 2, or otherwise (e.g., from a data storage device).

A second parameter map associating each of the plurality of voxels with a respective value of the second parameter is acquired at 320. The second parameter may also comprise any suitable parameter. The second parameter map may be acquired, for example, based on a third series of images acquired using a third MR pulse sequence as shown in FIG. 1, or based on a same series of images as used to acquire the first parameter map as shown in FIG. 2.

Figure 4:
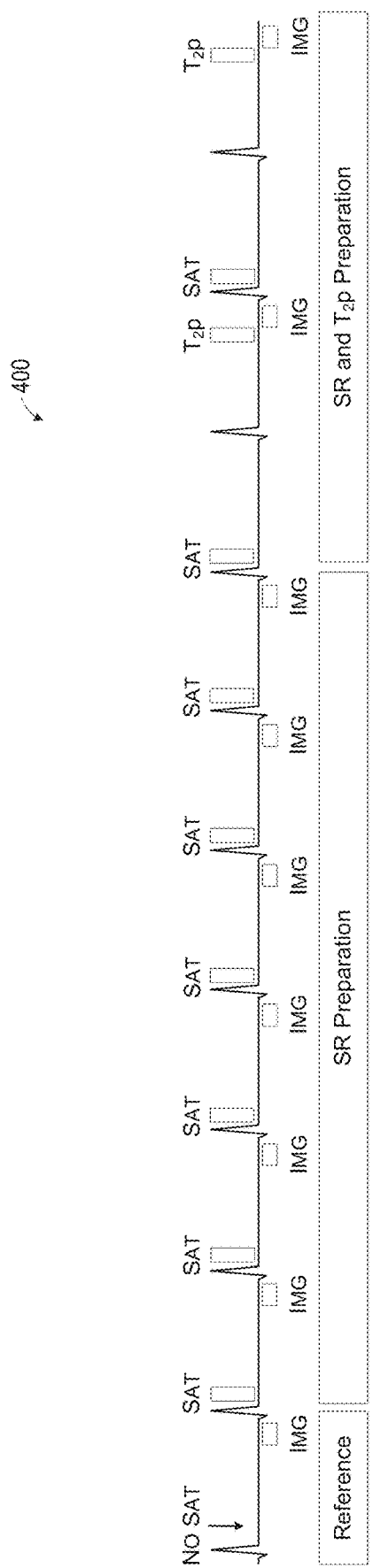
FIG. 4 illustrates a multi-parametric single-shot acquisition sequence according to some embodiments.

FIG. 4 illustrates a multi-parametric SASHA sequence which may be used to acquire a series of images from which a first parameter map and a second parameter map may be determined according to some embodiments. Sequence 400 of a series of single-shot bSSFP images, starting with an image without magnetization preparation, followed by a set of saturation-recovery (SR) images, and then by a set of images with both saturation and $T_2$-preparation. Single-shot readouts can effectively reduce or eliminate respiratory artifacts during steady free-breathing, improving the patient experience compared to traditional breath-holds. Although sequence 400 includes six SR images and two SR+$T_2$p images for an eleven heartbeat breath-hold, the numbers of SR images and SR+$T_2$p images are flexible. Sequence 400 uses an additional recovery heartbeat between the saturation pulse and $T_2$p pulses to increase the signal-to-noise ratio of the SR+$T_2$p images.

The longitudinal magnetization for each image acquired by sequence 400 can be described as a combination of $T_1$ weighting from the saturation pulse, optional $T_2$ weighting from the $T_2$-preparation pulse, and an additional effect from the linear bSSFP readout. Reference images are a limiting case of full $T_1$ recovery and no $T_2$ decay and images with only SR preparation have no $T_2$ decay component.

According to some embodiments, the foregoing may be modeled as: $S(T_1, T_2, A) = A\{1-[1-(1-e^{-TS/T_1})e^{-TE/T_2}]e^{-TD/T_1}\}$, where TD is the known fixed duration between the end of the $T_2$ preparation pulse and the center of k-space, TS is the saturation recovery time between the end of the saturation pulse and the start of the $T_{2p}$ pulse for SR+$T_{2p}$ images or start of imaging for SR-only images, $T_E$ is the $T_2$-preparation duration, $T_1$ is the longitudinal recovery time, $T_2$ is the transverse recovery time, and A is a constant. Other signal models may be used as is known in the art.

In order to acquire the $T_1$ and $T_2$ maps at 310 and 320, data from all acquired images are fit to the model, where $T_E=0$ is used for those images without $T_2$ preparation. A BB LGE image is determined based on the first parameter map at 330 and a DB LGE image is determined based on the first parameter map and the second parameter map at 340, for example as described above.

Next, at 350, the first parameter map, the second parameter map, the BB LGE image and the DB LGE image are displayed. Display may be facilitated by the inherent co-registration of pairs of the maps/images (in a case the first parameter map and the second parameter map were determined based on different image sequences) or all of the maps/images (in a case the first parameter map and the second parameter map were determined based on a same image sequence).

Figure 5:
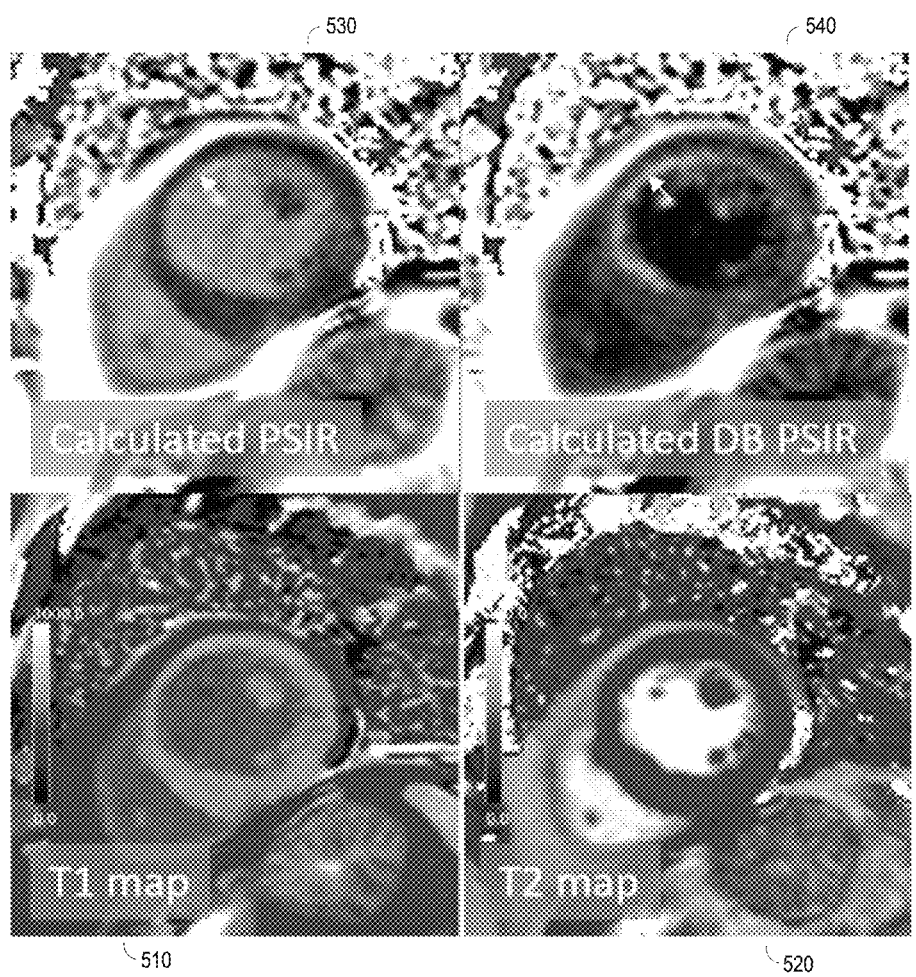
FIG. 5 illustrates two parametric maps and two PSIR LGE images generated according to some embodiments.
Figure 6:
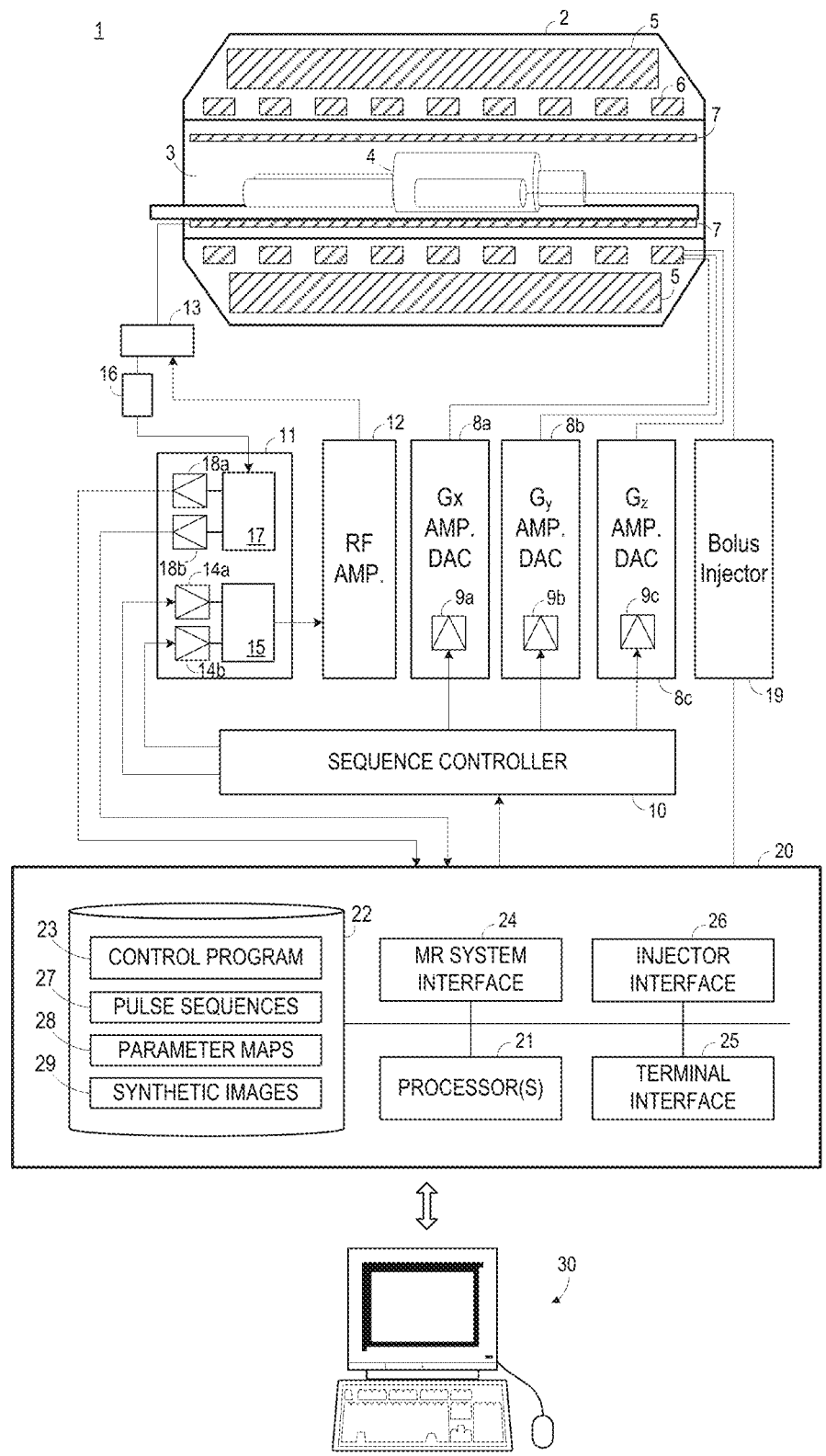
FIG. 6 is a block diagram of an MR imaging system according to some embodiments.

FIG. 5 illustrates first parameter map 510, second parameter map 520, BB LGE image 530 and DB LGE image 540 determined and displayed according to some embodiments. The arrows within BB LGE image 530 and DB LGE image 540 illustrate the benefit of generating a DB LGE image in a case where the BB LGE image exhibits poor contrast between the subendocardial MI and adjacent blood pool.

Process 300 may be executed by an MR system as is known in the art. FIG. 5 illustrates MR system 1 for executing a pulse sequence to acquire images according to some embodiments. Embodiments are not limited to MR system 1.

MR system 1 includes MR chassis 2, which defines bore 3 in which subject 4 is disposed. MR chassis 2 includes polarizing main magnet 5, gradient coils 6 and RF coil 7 arranged about bore 3. According to some embodiments, polarizing main magnet 5 generates a uniform main magnetic field ($B_0$) and RF coil 7 emits an excitation field ($B_1$).

According to MR techniques, a volume of material (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly oriented magnetic components in the perpendicular plane (the x-y plane) cancel out one another.

The material is then subjected to an excitation field (i.e., $B_1$) created by emission of a radiofrequency (RF) pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated, and signals are emitted by the excited spins as they return to their pre-excitation field state. The emitted signals are detected, digitized and processed to reconstruct an image using one of many well-known MR reconstruction techniques.

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF power amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and scans the alternating field which is produced as a result of precessing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18a and 18b convert the demodulated signals into real and imaginary components.

Computing system 20 receives the real and imaginary components from analog-digital converters 18a and 18b and reconstructs an image therefrom according to known techniques. System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random-access memory, and/or removable media (e.g., a thumb drive) mounted in a corresponding interface (e.g., a USB port).

Storage device 22 stores program code of control program 23. One or more processing units 21 may execute control program 23 to provide instructions to sequence controller 10 via MR system interface 24. For example, sequence controller 10 may be instructed to initiate a desired pulse sequence of pulse sequences 27. Pulse sequences 27 may include pulse sequences for acquiring perfusion data and diffusion data as described herein. Sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting MR signals.

Control program 23 may also be executed to control injector interface 26 as required by various pulse sequences of pulse sequences 27. In response, injector interface 26 controls media injector 19 to inject contrast media into subject 4 as is known in the art. For example, media injector 19 may be controlled to inject a designated amount of media into patient 4 at a designated rate and at a designated time prior to execution of a multi-parameter SASHA pulse sequence.

Control program 23 may further be executed to generate parameter maps 28 based on images acquired as described herein, and to generate synthetic BB and DB LGE images 29 based on parameter maps 28 acquired as described herein.

Parameter maps 28 and synthetic LGE images 29 may be provided to terminal 30 via terminal interface 25 of system 20. Terminal interface 25 may also receive input from terminal 30, which may be used to provide commands to control program 23 in order to control sequence controller 10 and/or other elements of system 1. The commands may include commands to initiate an imaging sequence to acquire image data of a subject. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

Embodiments described herein are solely for the purpose of illustration. Those in the art will recognize other embodiments may be practiced with modifications and alterations to that described above.

What is claimed is:

1. A system comprising:
a chassis defining a bore;
a main magnet to generate a polarizing magnetic field within the bore;
a gradient system to apply a gradient magnetic field to the polarizing magnetic field;
a radio frequency system to transmit radio frequency pulses to an object disposed within the bore and to receive signals from the object;
a display; and
a computing system to execute program code to:
determine a first map of a first parameter based on first signals received from the object, the first map associating each of a plurality of voxels with a respective value of the first parameter, the first parameter quantifying a first physical characteristic;
determine a second map of a second parameter based on the first signals received from the object, the second map associating each of the plurality of voxels with a respective value of the second parameter, the second parameter quantifying a second physical characteristic; and
determine a dark-blood phase-sensitive inversion recovery late gadolinium enhancement (DB PSIR LGE) image based on the first map of the first parameter and on the second map of the second parameter; and
display the first map, the second map, and the DB PSIR LGE image on the display.

2. A system according to claim 1,
wherein the first signals received from the object comprise second signals received from the object and third signals received from the object,
wherein determination of the first map is based on the second signals and not on the third signals, and
wherein determination of the second map is based on the third signals and not on the second signals.

3. A system according to claim 2, wherein the first parameter is $T_1$ relaxation time and the second parameter is $T_2$ relaxation time.

4. A system according to claim 1, wherein the first parameter is $T_1$ relaxation time and the second parameter is $T_2$ relaxation time.

5. A system according to claim 4, wherein generation of the first plurality of signals comprises control of the radio frequency system to transmit radio frequency pulses to the object according to a multi-parametric saturation-recovery single-shot acquisition pulse sequence.

6. A system according to claim 4, wherein determination of the DB PSIR LGE image comprises determination of $(1-(1-((1-2e^{-T_{D1}/T_1})e^{-T_E/T_2}))e^{-T_{D2}/T_1})$ for each voxel, where first sequence delay time $T_{D1}$, second sequence delay time $T_{D2}$, and echo time $T_E$ are values to null normal myocardium and suppress blood.

7. A system according to claim 4, wherein determination of the DB PSIR LGE image comprises determination of a null value for each voxel associated with normal myocardium, determination of a fixed value for each voxel associated with blood, and determination of a respective value for other voxels not associated with normal myocardium or blood which is directly proportional to the respective $T_1$ value of the other voxels.

8. A method comprising:
determining a first map of a first parameter based on first signals acquired by a magnetic resonance scanner, the first map associating each of a plurality of voxels with a respective value of the first parameter, the first parameter quantifying a first physical characteristic of an object represented by the plurality of voxels;
determining a second map of a second parameter based on the first signals, the second map associating each of the plurality of voxels with a respective value of the second parameter, the second parameter quantifying a second physical characteristic of the object; and
determining a dark-blood phase-sensitive inversion recovery late gadolinium enhancement (DB PSIR LGE) image based on the first map of the first parameter and on the second map of the second parameter.

9. A method according to claim 8,
wherein the first signals comprise second signals acquired by the magnetic resonance scanner in response to a first pulse sequence and third signals acquired by the magnetic resonance scanner in response to a second pulse sequence,
wherein determining the first map comprises determining the first map based on the second signals and not on the third signals, and
wherein determining the second map comprises determining the second map based on the third signals and not on the second signals.

10. A method according to claim 9, wherein the first parameter is $T_1$ relaxation time and the second parameter is $T_2$ relaxation time.

11. A method according to claim 8, wherein the first parameter is $T_1$ relaxation time and the second parameter is $T_2$ relaxation time.

12. A method according to claim 11, wherein the first signals are acquired by controlling a radio frequency system of the magnetic resonance scanner to transmit radio frequency pulses to the object according to a multi-parametric saturation-recovery single-shot acquisition pulse sequence.

13. A method according to claim 11, wherein determining the DB PSIR LGE image comprises determining $(1-(1-((1-2e^{-T_{D1}/T_1})e^{-T_E/T_2}))e^{-T_{D2}/T_1})$ for each voxel, where first sequence delay time $T_{D1}$, second sequence delay time $T_{D2}$, and echo time $T_E$ are values to null normal myocardium and suppress blood.

14. A method according to claim 11, wherein determining the DB PSIR LGE image comprises determining a null value for each voxel associated with normal myocardium, determining a fixed value for each voxel associated with blood, and determining a respective value for other voxels not associated with normal myocardium or blood which is directly proportional to the respective $T_1$ value of the other voxels.

15. A computing system comprising:
a memory storing processor-executable program code; and
one or more processors to execute the program code to:
determine a first map of a first parameter based on first signals acquired by a magnetic resonance scanner, the first map associating each of a plurality of voxels with a respective value of the first parameter, the first parameter quantifying a first physical characteristic of an object represented by the plurality of voxels;
determine a second map of a second parameter based on the first signals, the second map associating each of the plurality of voxels with a respective value of the second parameter, the second parameter quantifying a second physical characteristic of the object; and
determine a dark-blood phase-sensitive inversion recovery late gadolinium enhancement (DB PSIR LGE) image based on the first map of the first parameter and on the second map of the second parameter.

16. A system according to claim 15,
wherein the first signals comprise second signals acquired by the magnetic resonance scanner in response to a first pulse sequence and third signals acquired by the magnetic resonance scanner in response to a second pulse sequence,
wherein determination of the first map is based on the second signals and not on the third signals, and
wherein determination of the second map is based on the third signals and not on the second signals.

17. A system according to claim 15, wherein the first parameter is $T_1$ relaxation time and the second parameter is $T_2$ relaxation time.

18. A system according to claim 17, wherein generation of the first signals comprises control of a radio frequency system of the magnetic resonance scanner to transmit radio frequency pulses to the object according to a multi-parametric saturation-recovery single-shot acquisition pulse sequence.

19. A system according to claim 17, wherein determination of the DB PSIR LGE image comprises determination of $(1-(1-((1-2e^{-T_{D1}/T_1})e^{-T_E/T_2}))e^{-T_{D2}/T_1})$ for each voxel, where first sequence dead time $T_{D1}$, second sequence dead time $T_{D2}$, and echo time $T_E$ are values to null normal myocardium and suppress blood.

20. A system according to claim 17, wherein determination of the DB PSIR LGE image comprises determination of a null value for each voxel associated with normal myocardium, determination of a fixed value for each voxel associated with blood, and determination of a respective value for other voxels not associated with normal myocardium or blood which is directly proportional to the respective $T_1$ value of the other voxels.

* * * * *